United States Patent [19]
Larson

[11] Patent Number: 5,774,336
[45] Date of Patent: Jun. 30, 1998

[54] HIGH-TERMINAL CONDUCTIVITY CIRCUIT BOARD

[75] Inventor: Ralph I. Larson, Bolton, Mass.

[73] Assignee: Heat Technology, Inc., South Lancaster, Mass.

[21] Appl. No.: 712,950

[22] Filed: Sep. 13, 1996

Related U.S. Application Data

[63] Continuation-in-part of Ser. No. 603,210, Feb. 20, 1996.

[51] Int. Cl.$^6$ ....................................................... H05K 7/20
[52] U.S. Cl. .......................... 361/720; 174/252; 361/704; 428/901
[58] Field of Search ................................... 174/16.3, 252, 174/256–257, 259, 260, 262, 265, 266; 361/704, 707, 712, 713, 719, 720; 428/901

[56] References Cited

U.S. PATENT DOCUMENTS

| Re. 29,784 | 9/1978 | Chadwick et al. ........................ 174/252 |
| 3,165,672 | 1/1965 | Gellert ..................................... 317/100 |
| 3,590,328 | 6/1971 | Frescura . | |
| 4,056,681 | 11/1977 | Cook, Jr. ............................. 174/52 FP |
| 4,420,767 | 12/1983 | Hodge et al. . | |
| 4,633,035 | 12/1986 | McMonagle ........................... 174/68.5 |
| 4,675,784 | 6/1987 | Dahlberg et al. ........................ 361/386 |
| 4,681,655 | 7/1987 | Potter . | |
| 4,681,666 | 7/1987 | Potter et al. . | |
| 4,873,615 | 10/1989 | Grabble . | |
| 5,374,788 | 12/1994 | Endoh et al. ............................ 174/257 |
| 5,376,232 | 12/1994 | McKenney et al. . | |
| 5,448,450 | 9/1995 | Burns . | |

OTHER PUBLICATIONS

*The Thermal Clad Thermal Management Substrate IMS™*, Jan. 1995, Revision 10, The Bergquist Company, pp. 1–23.

*Primary Examiner*—Gregory D. Thompson
*Attorney, Agent, or Firm*—Christopher S. Daly; Nutter, McClennen & Fish LLP

[57] ABSTRACT

A thermally efficient circuit board has a base layer with high thermal conductivity and a thermal expansion coefficient close to that of silicon, such as aluminum silicon carbide. Above the base layer is a layer of anodized metal, either a separate material, such as aluminum, which is formed on the base and then anodized, or an anodized portion of the base itself. To the anodized metal is then applied a sealant material of lower thermal conductivity, but good electrically insulative and adhesive qualities, such as Teflon FEP. The sealant flows into cavities in the porous anodized metal structure, creating a well-anchored bond. A metal foil layer is then bonded to the surface of the sealant, and used to pattern conductive circuit paths using conventional methods.

8 Claims, 10 Drawing Sheets

HIGH-TERMINAL CONDUCTIVITY CIRCUIT BOARD

RELATED APPLICATIONS

This Application is a continuation-in-part of application Ser. No. 08/603,210, filed Feb. 20, 1996.

BACKGROUND OF THE INVENTION

1. Field Of The Invention

This invention relates to thermal control of board-mounted electronic devices and, more specifically, to an improved circuit board construction with high thermal efficiency.

2. Description of the Related Art

Electronic devices are typically mounted and electrically connected to a board, commonly referred to as a circuit board. The circuit board is usually comprised of electrical interconnects which are, in turn, connected to the electronic devices mounted thereto. The circuit board can either be an all-in-one electronic device, or can be plugged into an electrical connector which connects it to other external electronic devices.

The electronic devices mounted to a circuit board can be any of a number of conventional or hybrid devices such as resistors, capacitors, pin-mounted integrated circuit (IC) packages, surface-mounted IC packages, and the like. When operated, such devices dissipate energy in the form of heat. If the device is unable to transfer enough of its heat to the surrounding air, the elevated operating temperature of the device can result in its premature failure.

Generally speaking, heat can be transferred from the electronic device to a coolant, (e.g. air) either directly or indirectly. The direct method is accomplished by circulating the air over the electronic device. Heat is absorbed from the device by the air, which is then exhausted to the ambient environment. For low-power devices, the surface area of the electronic device itself is sufficient to allow removal of the desired amount of heat with a sufficiently-low rise in device temperature. Higher power devices, however, often require the use of a heat sink attached to, and in thermal contact with, the electronic device. The heat sink is a high thermal conductivity material with a large surface area which spreads heat from the device over a greater surface area, improving the efficiency of the transfer of heat to the circulating air. If designed correctly, a heat sink can keep the temperature of the electronic device lower than that of a similar device without a heat sink. However, the expense of manufacturing a heat sink and attaching it to a device can significantly increase the overall cost of the device.

The indirect method of removing heat from an electronic device involves transferring heat from the device to the circuit board. Since the circuit board is already attached to the electronic device to be cooled, it can act much like a heat sink itself. Heat is conducted (typically downward) from the device to the circuit board. Solder bumps and thermal shims or posts can be also be used to create high thermal conductivity paths deeper into the board, since the circuit board itself is typically not a good thermal conductor.

To improve the conduction of heat from the device to the air, the circuit board must conduct heat laterally away from the electronic device. This spreads the heat over a larger area of the circuit board and increases the surface area from which air circulating over the circuit board may absorb the heat. Thus, the efficiency of the thermal spreading within the circuit board is an important factor in how well heat can be transferred from an electronic device to the ambient air.

As mentioned above, circuit boards are typically very poor conductors of heat. This is mainly due to the fact that they consist of interspersed metal and non-metal layers. The non-metal layers are usually poor thermal conductors. The metal layers do not significantly improve the thermal conductivity of the circuit board because they tend to be thin and discontinuous.

Prior art attempts at reducing the thermal resistance of a circuit board include the use of thick metal layers which have no electrical purposes (except when such layers are used as a ground plane). The thick metal layers are made continuous, and therefore provide significantly improved thermal spreading. This, in turn, helps to limit the temperature rise of the electronic devices. Typically, the circuit board also includes a layer of electrically insulative material between the metal layer and the electronic device to provide the necessary electrical isolation.

One problem with the use of thick metal layers in circuit boards is that the metal layer, the insulator layer, and the electronic device itself all have different thermal expansion properties. That is, as the temperature of the circuit board increases, the device, the insulator and the metal all expand by different amounts This results in thermally-induced stresses which can cause the electrical connections to the electronic devices to fatigue and fail.

SUMMARY OF THE INVENTION

The present invention provides a circuit board which is optimized for two thermal factors: the ultimate electronic device operating temperature; and the level of thermal stress induced by the heating. High levels of stress are developed when there is a mismatch in the degree of thermal expansion of materials which are bonded together. Therefore, to minimize the thermal expansion stress among the layers of the circuit board and the ICs mounted to the circuit board, it is desirable for the materials involved to have identical or closely-matched thermal expansion coefficients. However, in order to minimize the operating temperature of the IC, it is also desirable to use materials with high thermal conductivity. Generally, materials that are good thermal conductors, have high thermal expansion coefficients, whereas materials with low thermal conduction tend to have low thermal expansion coefficients.

The present invention comprises a multi-layered circuit board with a relatively thick base layer of material having relatively high thermal conductivity and a thermal expansion coefficient close to that of the IC material (typically silicon). In the preferred embodiment, this material is aluminum silicon carbide. The high thermal conductivity provides good thermal spreading within the board, while the matched coefficients of thermal expansion minimize thermal stress between the circuit board and the IC.

In the present invention, the thermal conductivity of the electrically-insulating layer between the base and the electrical circuit paths of the circuit board is maximized. This is accomplished by combining a relatively thin layer of anodized metal with an insulating sealant. The anodized metal may different than the base material, or may be an anodized portion of the base material itself. In the preferred embodiment, a layer of aluminum is formed on the surface of the base layer. The aluminum is then anodized by exposure to sulfuric acid and electric current to create an aluminum oxide layer on the outer surface. This aluminum oxide layer is typically 0.002-in-thick and consumes a 0.001-in-thick portion of the original aluminum coating.

The anodized metal, whether part of the base or a separate material, has a porous structure. An electrically insulative sealant material is then applied to the anodized metal. In the preferred embodiment, the sealant is Teflon FEP. Both aluminum oxide and Teflon FEP are relatively good electrical insulators, and provide the necessary isolation of the base layer from the printed circuit paths of the circuit board. The Teflon also acts as an adhesive to which an upper layer may be attached. In the present invention, a conductive foil (preferably copper) is laminated to the top of the sealant-filled aluminum oxide while the sealant is still in its liquid state. When the sealant hardens, the foil is firmly attached to it and, consequently, to the base. The foil is then post-processed in a conventional manner (such as photoetching) to form electrical traces that are used to provide electrical connection to electronic devices on the circuit board.

While the sealant material has a thermal conductivity which is low compared to the copper and the aluminum silicon carbide, the thermal effect of the sealant is minimized by its integration with the aluminum oxide. Aluminum oxide has relatively good thermal conductivity, and its porous structure allows it to serve as a matrix to the sealant material which flows into its pores. While the microscopic cavities of the anodized metal allow anchoring of the sealant material, the portions surrounding the cavities (which are closer to the metal foil) provide natural thermal vias between the copper foil and the base layer. Thus, the thermal conductivity of the anodized metal/sealant is better than other composite layers, and significantly better than that of a sealant alone. Furthermore, the added bonding strength provided by the anchoring action of the aluminum oxide pores allows the overall thickness of this layer to be kept to a minimum, thus further minimizing the thermal resistance between the board surface and the base layer.

Single or double-layer tapes, such as those made of Kaptone® (a registered trademark of E. 1. du Pont de Nemours & Co., Inc.), can also be used with present invention to provide multi-layered circuit boards. This structure is commonly referred to as a flexible ("flex") circuit. Flex circuits can have very fine electrical traces with pitches on the order of 0.004 inch. This allows components to be densely located on the circuit board as compared to conventional circuit board layouts. Electronic devices are typically mounted directly to the Kapton tape but, alternatively, holes can be etched into the Kapton to allow the electronic devices to be directly mounted to the Teflon for better thermal conduction.

BRIEF DESCRIPTION OF THE DRAWINGS

The foregoing features of this invention, as well as the invention itself, may be more fully understood from the following detailed description of the drawings, in which.

DETAILED DESCRIPTION OF THE PREFERRED EMBODIMENTS

Figure 1:
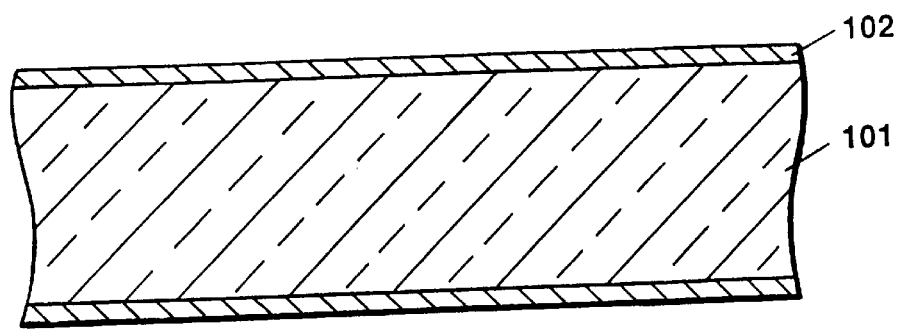
FIG. 1 i s a cross-sectional side view of a first stage of circuit board fabrication according to the present invention.
Figure 2:
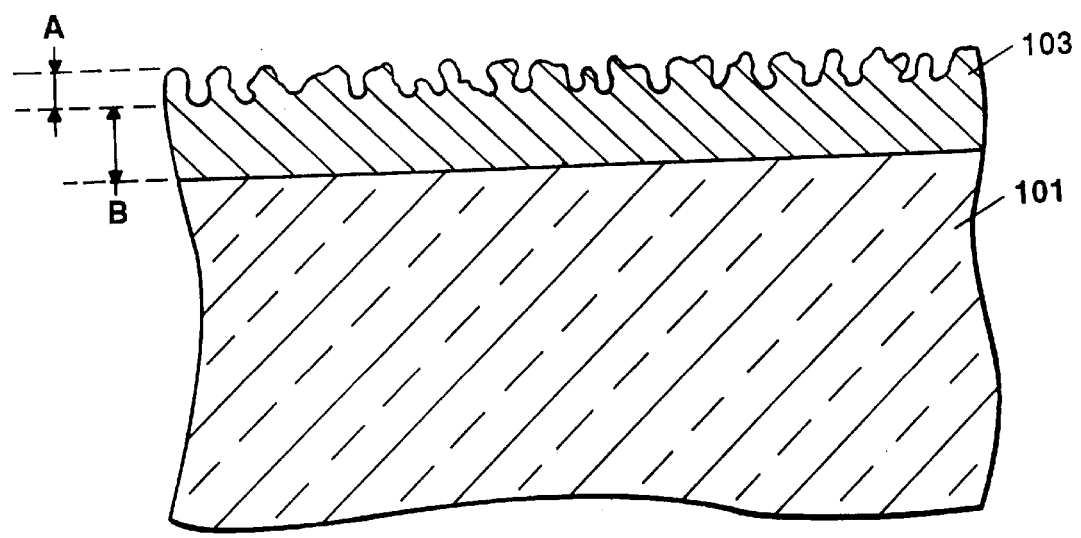
FIG. 2 is a cross-sectional side view of a second stage of circuit board fabrication according to the present invention.
Figure 3:
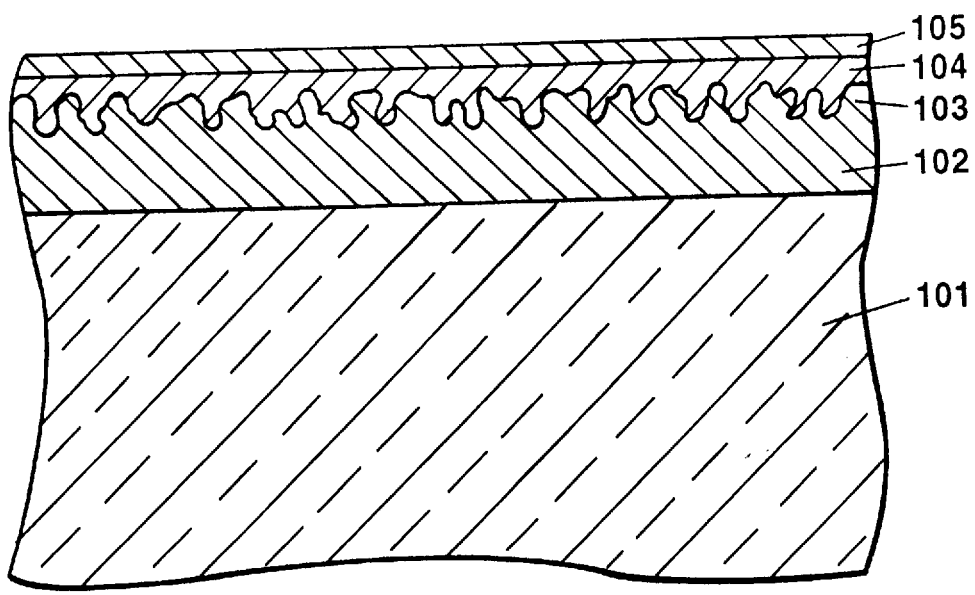
FIG. 3 is a cross-sectional side view of a third stage of circuit board fabrication according to the present invention.

The fabrication steps for the circuit board of the present invention are described herein with reference to FIGS. 1–3. Shown in FIG. 1 is a base layer 101 formed from a material having good thermal conductivity, and a thermal expansion coefficient close to that of silicon (i.e. is relatively low). The thermal expansion coefficient is matched to silicon since most ICs tend to be silicon-based and, thus, thermal stress due to mismatched thermal expansion coefficients is minimized.

The thermal conductivity of the base layer 101 provides good lateral heat spreading within the circuit board. In the preferred embodiment, the base material is aluminum silicon carbide. However, those skilled in the art will recognize that other materials having similar properties may also be used. The base 101 is significantly thicker than other layers of the circuit board. However, the base thickness may be customized to a particular board design, recognizing that the thermal spreading is better with a thicker base layer.

Formed on the surface of the base 101 in a conventional manner is an anodizeable metal, which in the preferred embodiment is aluminum layer 102. The layer 102 may be unnecessary if the base material is an anodizeable metal, such as aluminum. That is, it is possible to simply anodize the surface of the base material, rather than adding layer 102. However, in the preferred embodiment, the base material is aluminum silicon carbide, and layer 102 is therefore added to provide the anodizeable layer. Thus, the following description will refer to layer 102 as being a different material, although those skilled in the art will understand that layer 102 may simply be a region of base material 101 which is anodized.

Aluminum layer 102 may be formed onto the surface of base 102 as part of the fabrication process, or layers 101 and 102 may be purchased together, as aluminum silicon carbide is commercially available in sheet form with aluminum metal skins. In the preferred embodiment, the aluminum layer 102 is approximately 0.005 inch thick. It is noted that other anodizeable metals may be substituted for aluminum. These include niobium, molybdenum, tantalum, titanium and vanadium.

After its formation, the aluminum layer 102 is anodized using sulfuric acid and an appropriate electric current. This anodizing causes the formation of a layer 103 of aluminum oxide on the surface of the aluminum, and a resulting porous surface structure, as shown in FIG. 2. Dimensions "A" and "B" are used in FIG. 2 to depict, respectively, the porous aluminum oxide portion 103 and the non-porous aluminum portion 102 below. In the preferred embodiment, the aluminum is anodized to provide a porous aluminum oxide region 103 which is approximately 0.002 inch thick, while the non-porous aluminum region 102 is approximately 0.004 inch. Aluminum oxide has the benefits of being a good electrical insulator while having a relatively high thermal conductivity. It is noted that the pores shown in the drawing are not to scale and that, actually, the pore size is microscopic.

After anodizing, a sealant material 104 is applied to the aluminum oxide layer 103, as shown in FIG. 3. In the preferred embodiment, the sealant is fluorinated ethylene propylene (FEP), commonly referred to as Teflon® FEP ("Teflon" is a registered trademark of E. l. du Pont de Nemours & Co., Inc.). The Teflon FEP is heated to its melting temperature of approximately 300° C. It is then forced at a pressure of 275 P.S.I. into the porous surface of the aluminum oxide 103. The natural capillary action of the porous surface may assist in drawing the sealant 104 into the pores of the anodized aluminum layer. In one embodiment, a vacuum is maintained in the vicinity of the porous layer before and during the application of the sealant. The vacuum is later removed after the sealant 104 is applied, but while it is still in a liquid form. This enhances the drawing of the sealant into the pores of the aluminum oxide.

Teflon FEP is a good electrical insulator. The Teflon-filled aluminum oxide has a dielectric strength on the order of 2000 V/mil thickness. A 0.002 inch thick layer of this material thus has a total dielectric strength on the order of 4000 volts, which is more than sufficient for most electronics applications. The thermal conductivity of this layer is approximately one-third of pure aluminum oxide. Due to its thinness, it provides a minimal thermal resistance to the heat flowing through it.

Figure 4:
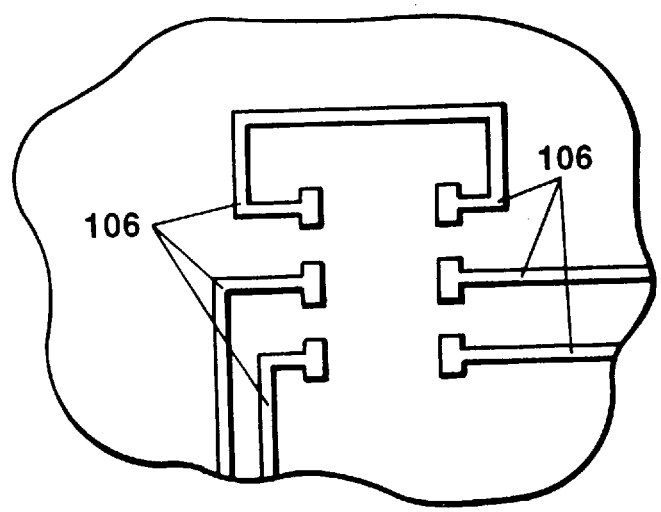
FIG. 4 is a top view of a circuit board according to the present invention.

Referring again to FIG. 3, a layer 105 of metal foil is laminated to the sealant layer 104 after its application. The sealant 104 may be used as an adhesive to secure the foil layer in place. In the preferred embodiment, the foil layer 105 is copper, but other types of electrically conductive material may also be used. A typical copper foil used herein would be a 0.5 ounce to 3 ounce copper. Once the foil 105 is firmly adhered to the sealant 104, electrical traces may be formed from the foil material. This is demonstrated by FIG. 4, which depicts a top view of a portion of the fabricated circuit board according to the present invention. As shown, electrical traces 106 are formed from the foil 105 to provide the desired circuit pathways. In the present embodiment, the foil 105 is photolithographically imaged and etched to expose the adhesive sealant 104, thus electrically isolating the traces 106.

As demonstrated by FIG. 3, the sealant material 104 flows into the pores of the anodized metal 103. In essence, the anodized metal 103 functions as a matrix for the sealant 104, resulting in an anchoring of the sealant to the anodized metal, and correspondingly good bond strength between the two materials. This matrix structure also provides an array of natural thermal vias. The aluminum oxide 103 has much better thermal conductivity than the sealant. The portions of the aluminum oxide 103 which surround the cavities in its porous structure are particularly close to the foil 105, and provide heat conducting channels between the foil and the base material 101, with only a small amount of lower-thermal conductivity sealant material 104 to cross. Thus, good overall thermal conduction is achieved between the foil 105 and the base 101, while maintaining a constant adhesive surface between the sealant 104 and the foil.

Figure 5:
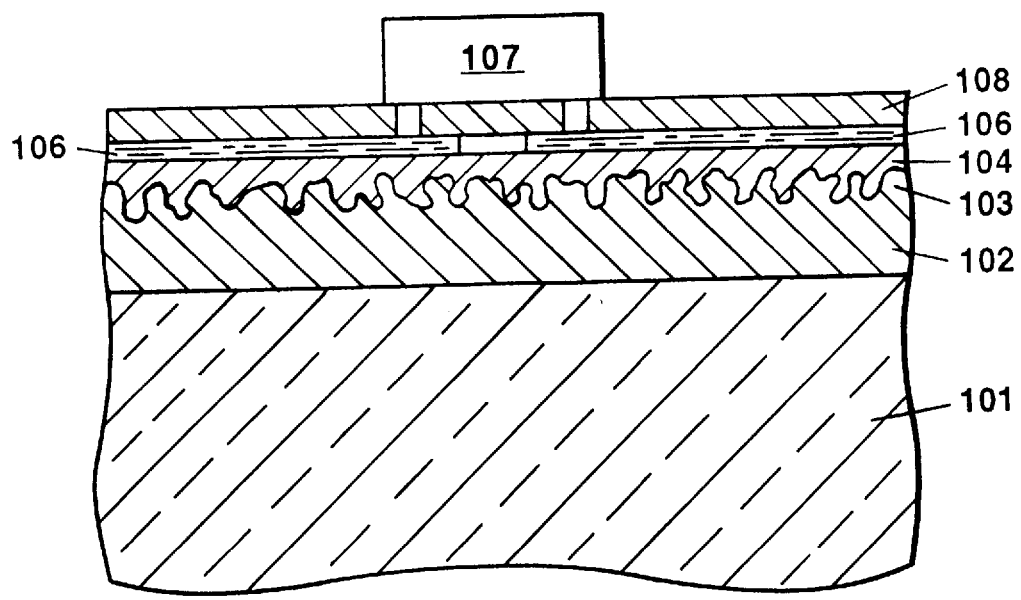
FIG. 5 is a cross-sectional side view of a circuit board according to the present invention upon which a pin-mounted component resides.

FIG. 5 depicts a typical application of the present invention in which an electrical component 107 is soldered or epoxied to the electrical traces 106. Given the finite thickness of the electrical traces 106 and the relative length of the leads of component 107, a thermally-conductive filler 108 is used between the component 107 and the adhesive sealant 104. This allows a high thermal conductivity path between the component 107 and the sealant 104 to be maintained.

Figure 6:
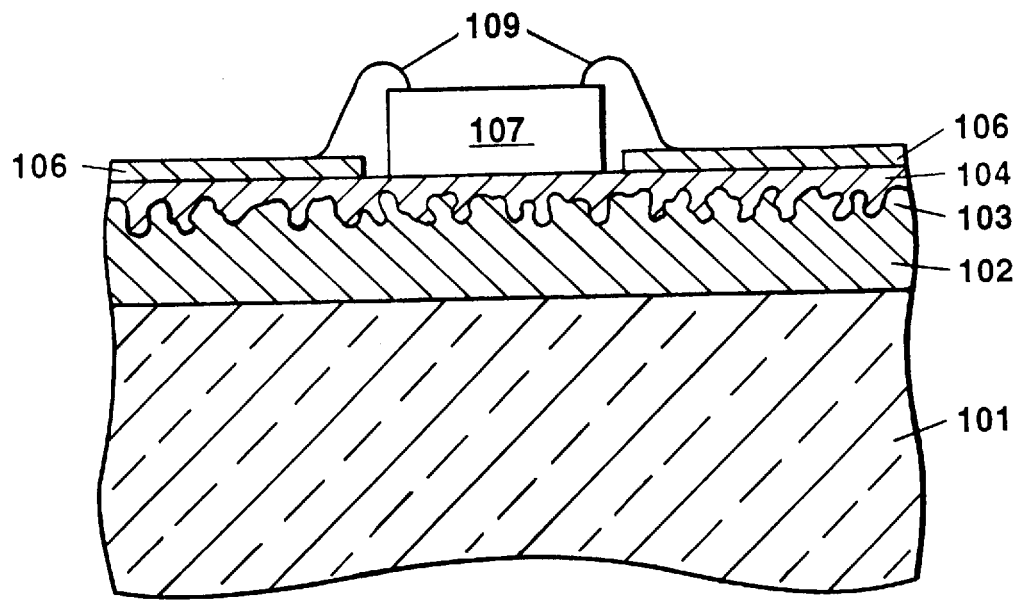
FIG. 6 is a cross-sectional side view of a circuit board according to the present invention upon which a component with conductors on its upper side is mounted.

FIG. 6 shows another application of the present invention in which the electrical component 107 is directly bonded to the adhesive sealant 104. Electrical wires 109 are connected between the electrical traces 106 and the electrical contacts of component 107, which are located on the component's top surface. In this configuration, the component itself is in physical contact with the sealant 104, and the need for a conductive filler material 108 (as shown in FIG. 5) is eliminated.

Figure 7:
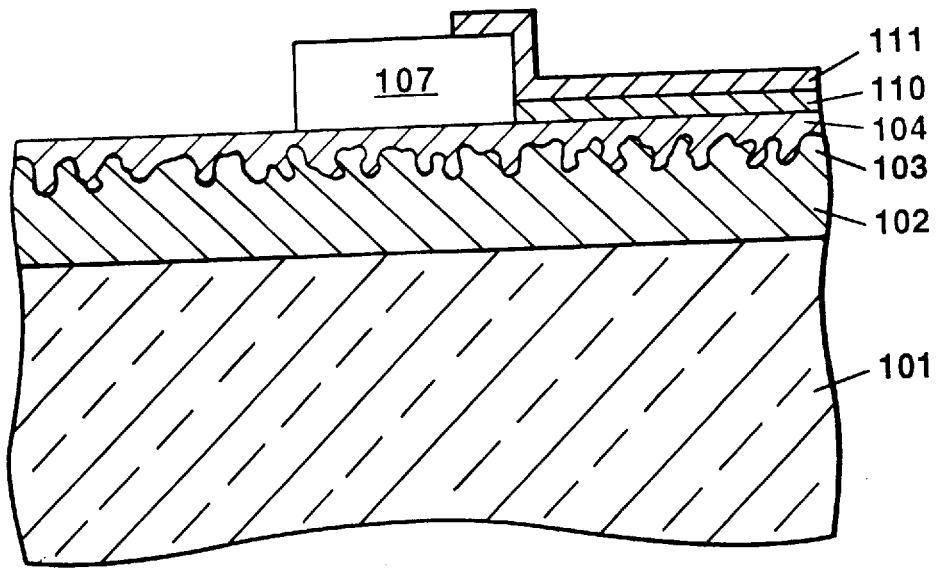
FIG. 7 is a cross-sectional side view of a circuit board according to the present invention upon which a component and a Kapton tape with electrical traces is mounted.

FIG. 7 shows still another application of the present invention in which a Kapton tape 110 is used which has integral electrical traces 111. The use of this type of Kapton tape is common in the flexible circuit industry. In this embodiment, the layer of metal foil (FIG. 3) is eliminated, as the Kapton tape 110 is bonded directly to adhesive sealant 104. The electrical traces 111 are connected to the electrical device 107 by solder or epoxy to provide the desired electrical path.

Figure 8:
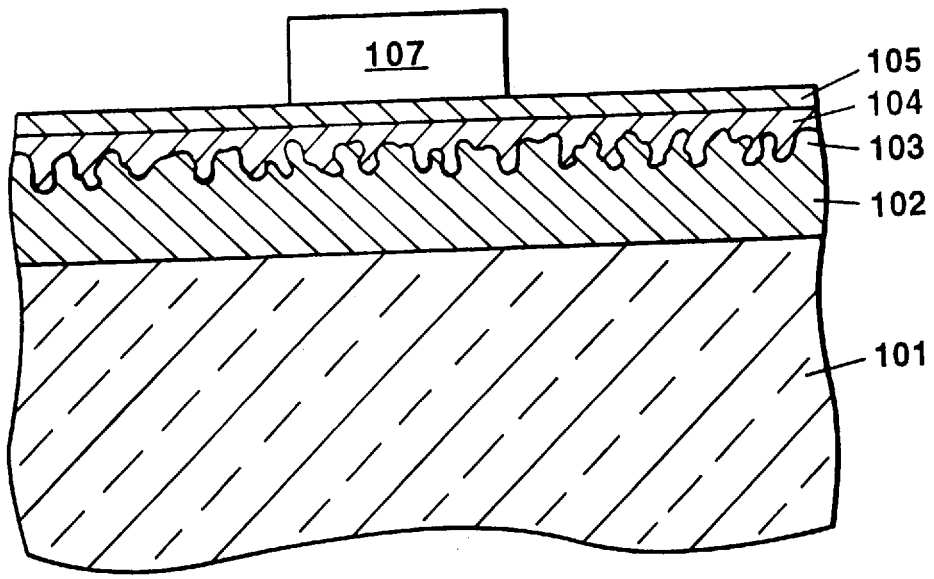
FIG. 8 is a cross-sectional side view of a circuit board according to the present invention upon which a surface-mounted component resides.

The embodiment of FIG. 8 is similar to the surface-mounted embodiment of FIG. 6, but has the component mounted on foil 105, rather than directly on sealant 104. This allows a lateral spreading of heat from the component not only through the base layer 101, but also through the foil layer 105. The contacts for component 107 may extend outward from the component to patterned conductors (not shown) which surround it. This embodiment may also be combined with the embodiment of FIG. 7, such that conductors of the Kapton tape (which may be two-sided or multi-layered) connect to both the top side and the bottom side of component 107.

In certain situations, the underside of the component 107 may also have electrical contacts which are connected directly to patterned conductors beneath the component. In such a case, thermally conductive material could optionally be applied to the recesses surrounding the patterned conductors beneath the component 107 so as to ensure optimum thermal conduction from the component to the sealant layer 104. The arrangement of FIG. 8 is particularly well-suited for applications in which thermal contact points, or exposed bare die, exist on the underside of the component 107 to provide direct thermal contact between the foil and the heat-dissipating material within the component package.

Steps in the manufacture of a printed circuit board 26 (FIG. 9D) having a thermally conductive via hole 24 (FIG. 9D) formed therein will now be described in conjunction with FIGS. 9–9D in which like elements are provided having like reference designations throughout the several views.

Figure 9:
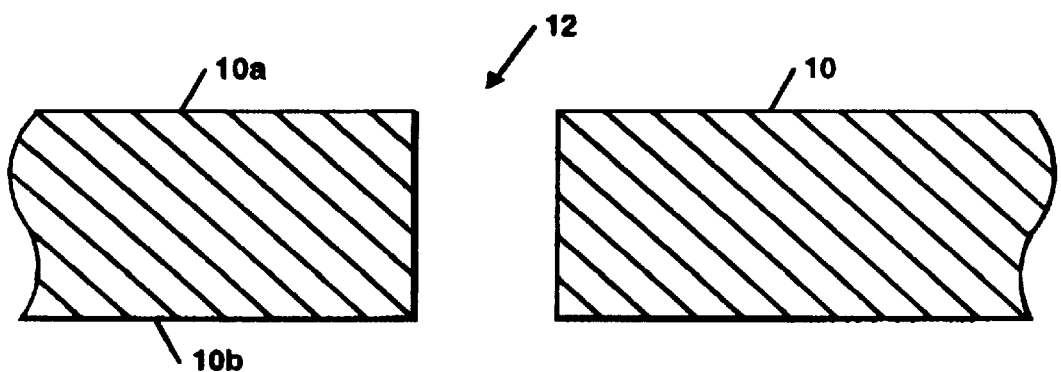
FIGS. 9–9D of series of cross-sectional views which show steps in the fabrication of a printed circuit board having a thermal via hole formed therein.

Referring now to FIG. 9, a thermally conductive substrate 10 having first and second opposing surfaces 10a and 10b has a hole 12 drilled or otherwise formed therein. In this particular embodiment, base layer 10 is provided having a thickness typically of about 0.0625 inches while hole 12 is provided having a diameter typically in the range of about 0.015 inches to 0.018 inches. Base layer to may be provided from any material which may be anodized. For example, base layer 10 may be provided from aluminum or alternatively base layer 10 may be provided from aluminum-silicon-carbide (AlSiC). As is known, AlSiC is material which cannot be anodized and thus in the case where base layer 10 is provided from AlSiC, the AlSiC must be provided having an aluminum skin disposed thereover. Furthermore, in the case where the base layer 10 is provided from AlSiC or some other non-anodizeable material, the base layer 10 should includes plugs or filler regions which are formed from an anodizeable material such as aluminum in which holes, such as hole 12, are drilled or otherwise formed. When forming a hole in such a filler region, the diameter of the hole should preferably be selected such that at least portions of a surface which form a wall of the are provided from the anodizeable filler material to thus allow at least portions of the wall to be anodized as will be discussed below in conjunction with FIG. 9A.

Figure 9A:
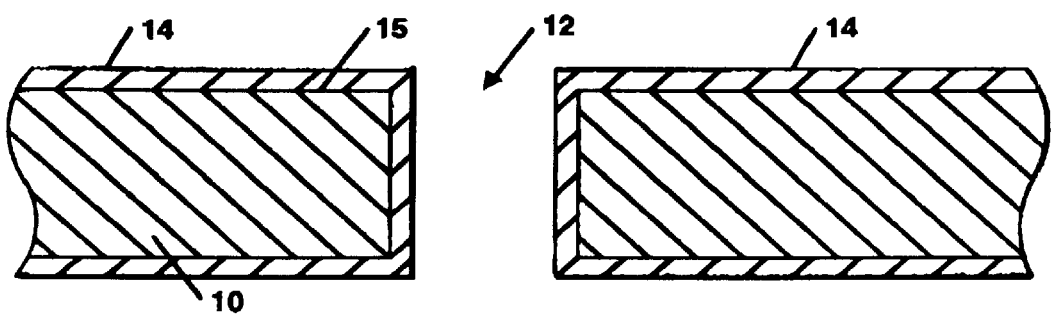

Referring now to FIG. 9A, base layer 10 is anodized using conventional techniques to provide an anodized layer 14 having a thickness typically of about 0.002 inches. Layer 14 extends through via hole 12 and thus contacts first and second surfaces 10a and 10b of base layer 10. It should be noted that to insure good adherence of anodized layer 14 to base layer 10 in the region of the via hole 14, the base layer is typically provided having edges 15 which are either chamfered or rounded to provide the edge 15 having an angle which is less than a ninety-degree angle at the surfaces 10 a, 10b where the openings of hole 12 occur.

Figure 9B:
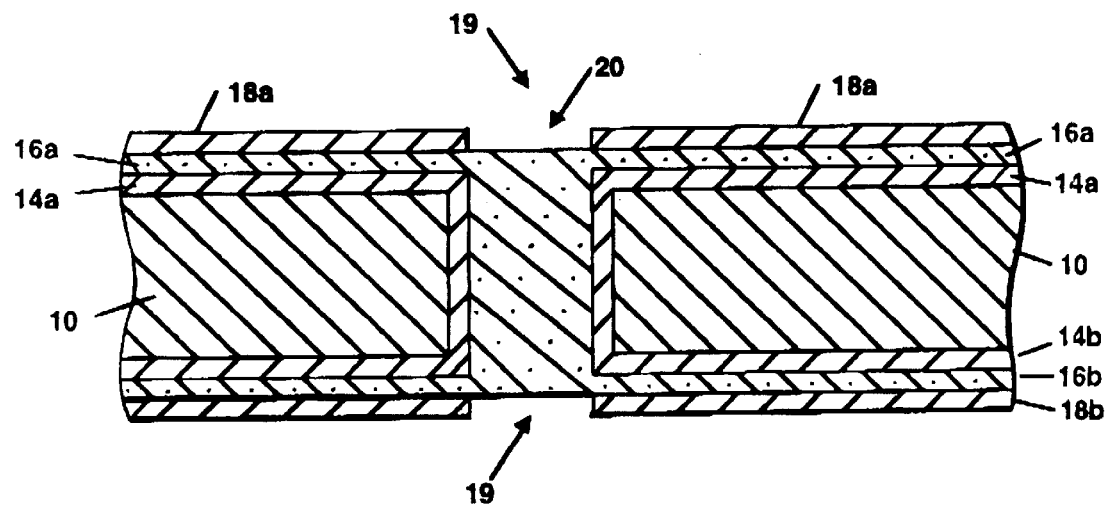

Referring now to FIG. 9B after the anodization step is complete, a bond film 16 is disposed over surfaces 10a, 10b of layer 10. In one particular embodiment, bond film 16 is provided as the type manufactured by Ausimont USA, Incorporated and identified as HYFLON® PFA. Those of ordinary skill in the art will appreciate of course that any bond film having similar mechanical, electrical and chemical properties may also be used. In some instances, bond film may fill the entire via hole as indicated by reference character 20 although it should be noted that in other instances bond film 16 may not completely and uniformly fill the via hole.

Next copper layers 18a, 18b generally denoted having a thickness typically in the range of about 0.001 inch to 0.005 inch is disposed over the bond film 16. Copper layer 18 has holes 19 formed therein. Holes 19 are aligned over each of the via holes 12 in base layer 10.

Figure 9C:
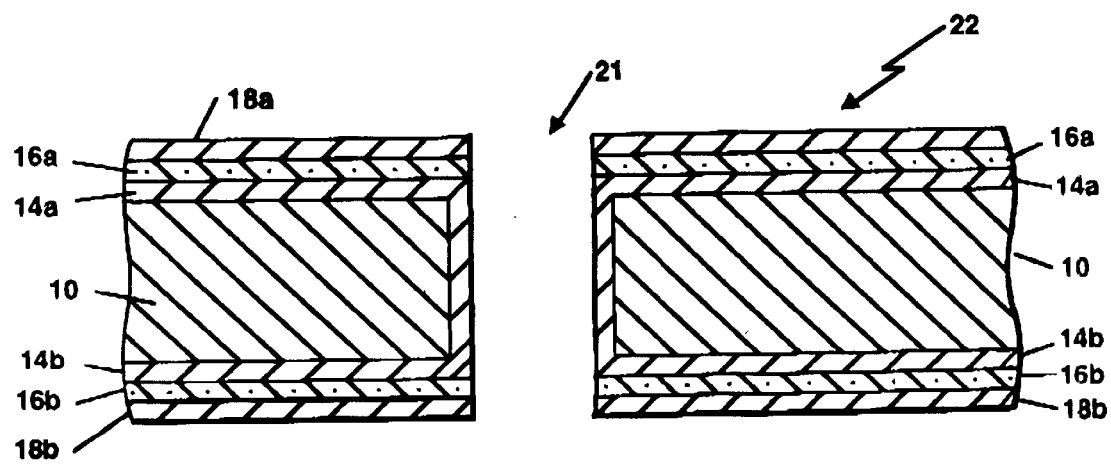
Figure 9D:
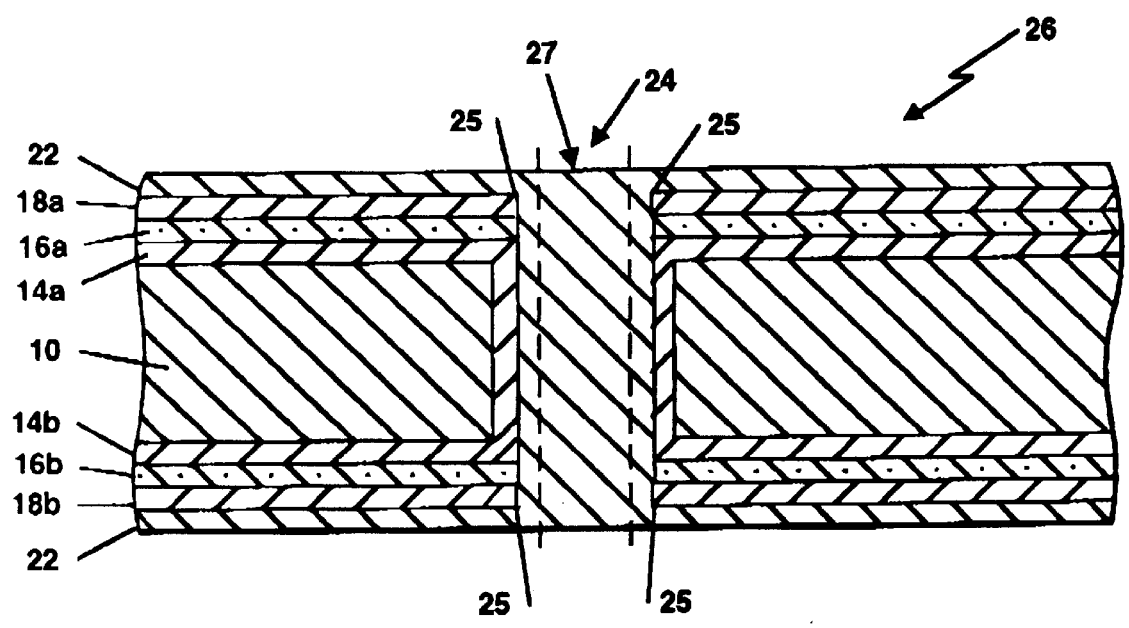

Referring now to FIG. 9C, the bond film 16 is removed from the via hole to provide a clear path between copper layers 18a and 18b through via hole 21. Bond film 16 may be removed from via hole 21 by a drilling process. In this case, upon insertion of a drill bit into via hole 21, the anodized surfaces of the via hole 21 act as a drill bushing to guide the drill bit through the via hole and to prevent the surfaces of the base layer 10 which form the outer walls of the via hole from being damaged by the drill bit.

To provide an electrically and thermally conductive path between layers 18a, 18b, the circuit board assembly is subjected to a plating process such as an electroless plating process, to deposit a conductive plating 22 over selected portions of copper layer 18a including surfaces of walls which define the via hole 21. As is known, in the plating process a soldermask is disposed over the conductors. The soldermask has openings formed therein to leave exposed selected portions of the copper layer 18 including the via hole 21. Thus, via hole 21 (FIG. 9C) is sensitized and plated using an electroless or electrolytical plating technique to provide an electrically and thermally conductive path from layer 18a to layer 18b through via hole 21 (FIG. 9C). As shown in FIG. 9C, after plating, the via hole may be provided as a filled via hole 24 which provides a thermally and electrically conductive path between copper layer 18a and copper layer 18b.

It should be noted that to insure good adherence of the plating layer 22 to the electrically conductive layers 18a, 18b in the region of the via hole 24, the conductive layers 18a, 18b are typically provided having edges which are either chamfered or rounded in the region of the via hole to provide edges 25 having an angle which is less than a ninety-degree angle at the corner surfaces on which the plating material must adhere. It should also be noted that although via hole 24 is here shown being completely filled with the plating material, in some embodiments it may not be possible to completely fill the via hole. In such embodiments, the plating layer 22 would adhere to the side surfaces of the hole and a center region 27 of the via hole here illustrated in phantom, would remain clear of plating, as a completely filled via hole 24. Whether via hole is completely filled or particularly filled depends upon a variety of factors including but not limited to the diameter of the via hole, the thickness of the anodized layer and the type and thickness of the plating layer.

Figure 10:
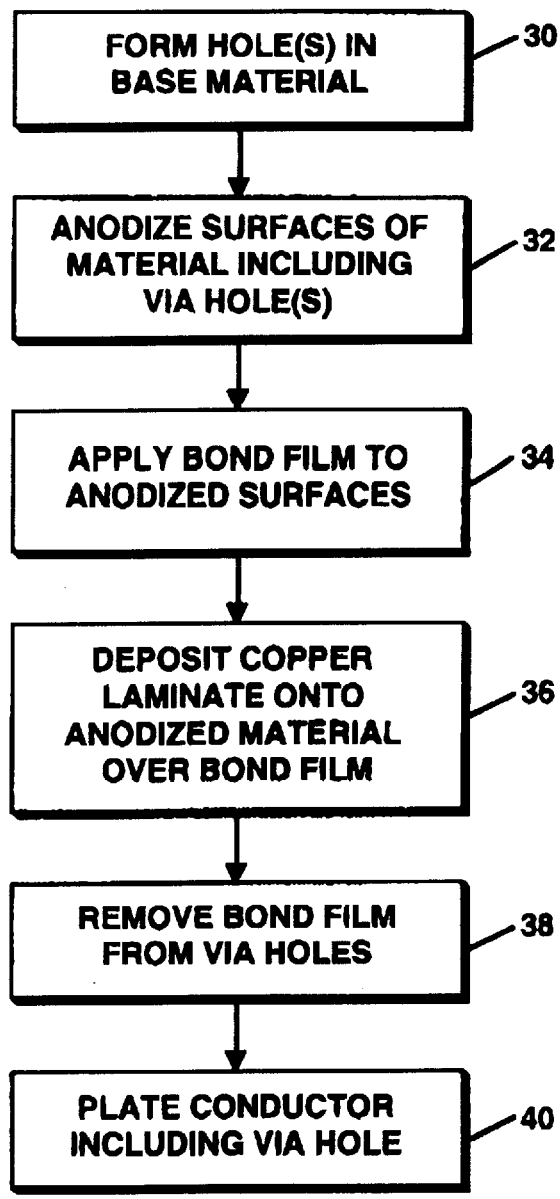
FIG. 10 is a flow diagram showing the steps in the fabrication of a printed circuit board having a thermal via hole formed therein.

Referring now to FIG. 10, the general steps used in the manufacture of a printed circuit board having a thermally conductive via hole are shown. First, as shown in step 30 one or more holes are drilled in a selected base material. The base material may be provided as any thermally conductive base layer which may be anodized using electrolytic, chemical or any other techniques known to those of skill in the art. For example, the base material may be provided from aluminum or alternatively the base material may be provided from aluminum silicon carbide (AlSiC) having an aluminum skin and having one or more plug regions of aluminum material provided therein.

In the case where the base material is provided from aluminum silicon carbide the holes are drilled through the aluminum plugs and a diameter of the holes thus drilled is selected to be less than a distance across the aluminum plug. Thus, after drilling a hole in a plug, a section of aluminum should extend between first and second opposing surfaces of the aluminum silicon carbide base layer.

Next as shown in step 32 selected surfaces of the base layer are anodized. It is important to note that this includes anodizing the walls of the base material which define the holes formed in the base material from the drilling step 30. Thus, in the case where the base material is provided from AlSiC or some other non-anodizeable base material, it is important that the above-mentioned plugs be made from an anodizeable material and that anodizeable material line the walls which form the holes.

Next as shown in step 34 a bond film is applied to the anodized surfaces of the base material on which a conductor is to be disposed.

Then as shown in step 36, a conductive layer is deposited over the Teflon bond film. The conductor may be provided, for example, as a rolled copper conductor. Next as shown in step 38 the bond film is removed from the via holes and finally as shown in step 40 a plating process is performed to provided a plating layer along the surfaces of the base material including the exposed surfaces of the via hole.

Figure 11:
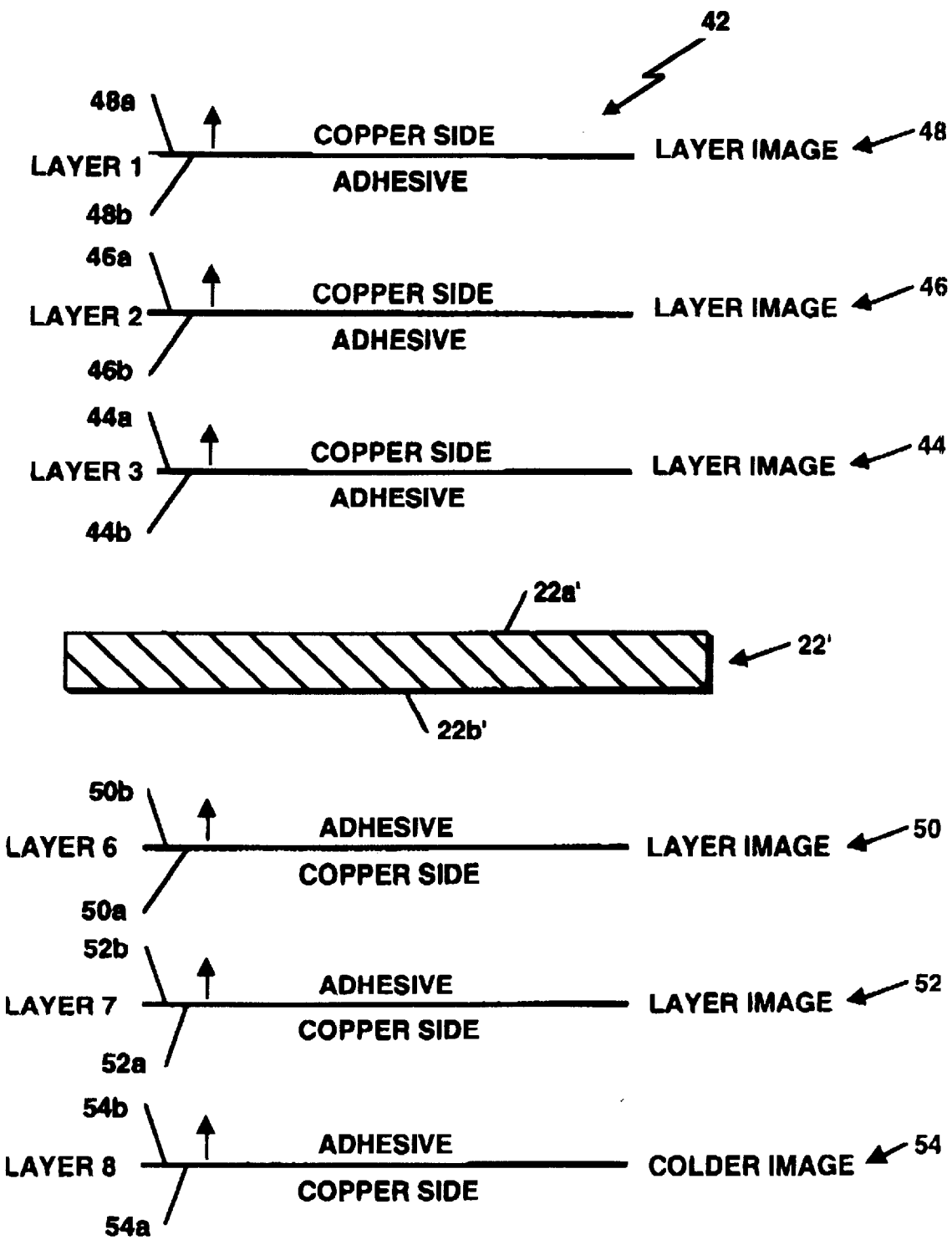
FIG. 11 is an exploded view of a multilayer printed circuit board.

Referring now to FIG. 11, a multilayer printed circuit board includes a blank 22' which may be similar to layer 22 described above in conjunction with FIG. 9C. A plurality of copper layers 44–48 each having respective top bottom surfaces 44a, 44b, 46a, 46b, 48a, 48b, are here disposed over surface 22a' of circuit board 22 and a second plurality of copper layers 50–54 each having respective top and bottom surfaces 50a, 50b, 52a, 52b, 54a, 54b are disposed over a second layer 22b' of circuit board 22'.

Figure 11A:
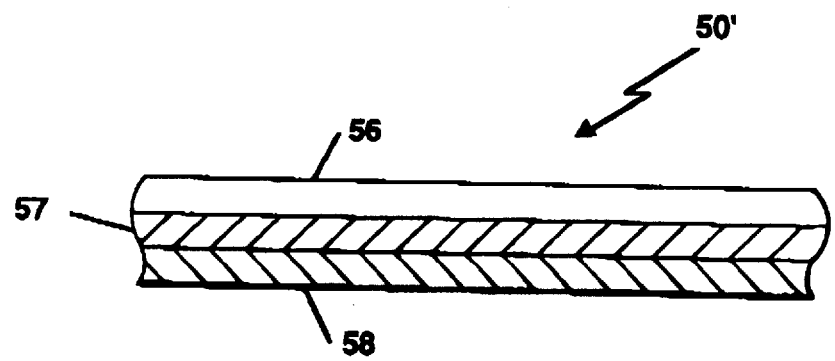
FIG. 11A is a cross-sectional side view of a layer in the multilayer printed circuit board of FIG. 11.

Referring briefly to FIG. 11A, each of the layers 44–54 include a copper film 58 having a polyimide layer 57 adhered to a first surface thereof and an adhesive layer 56 disposed over a first layer of the polyimide layer 57. Thus, each of the layers 44–54 are provided from three separate sheets or components.

Referring again to FIG. 11, although multilayer circuit board 42 is here shown having eight layers, those of ordinary skill in the art will appreciate that multilayer printed circuit board 42 may be provided having fewer or greater than eight layers.

Figure 12:
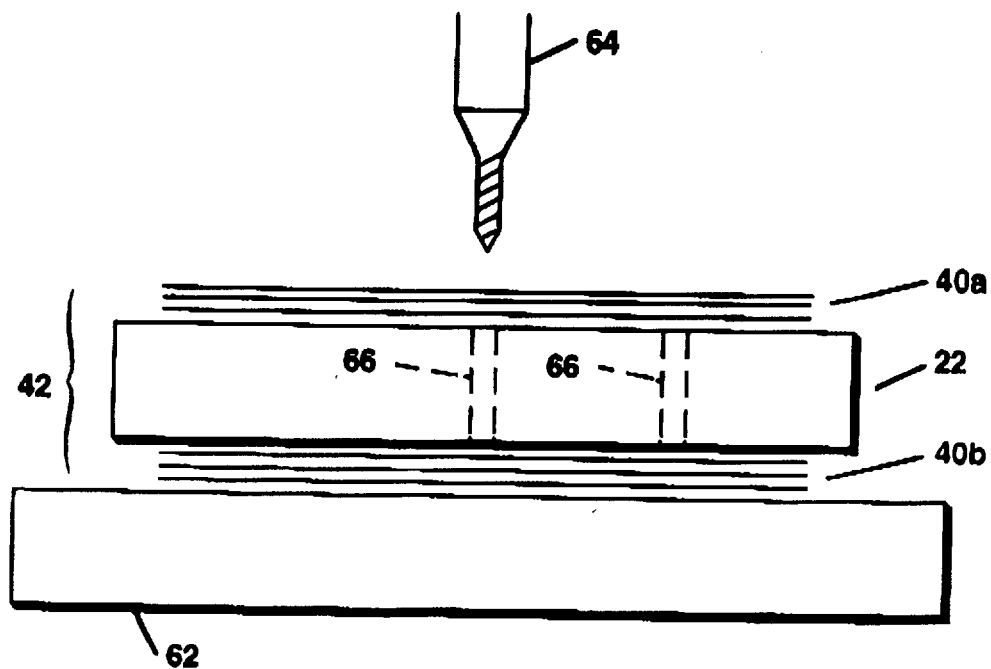
FIG. 12 is a diagrammatical view of plated through via holes in a multilayer printed circuit board.

Referring now to FIG. 12, once layers 44–54 are adhered to blank 22' to form regions 40a, 40b respectively the multilayer circuit board 42 is disposed over a clean drilling blank 62 and a plurality of via holes 66 are drilled into the multilayer circuit board 42 with a drill 64. A soldermask is disposed over selected portions of the exposed copper layers of the multilayer circuit board 42. Those portions of the conductive layers of the multilayer printed circuit board 42 not protected by the soldermask including the via holes 66 are subjected to a plating process as described above in conjunction with FIGS. 9–10.

With the arrangements described above in conjunction with FIGS. 9–9D and FIG. 12 the plated via holes porvides a thermally conductive path between each of the copper layers and a core layer such as blank 22' (FIG. 11).

Having described preferred embodiments of the invention, it will now become apparent to one of ordinary skilled in the art that other embodiments incorporating the concepts may be used. It is felt, therefore, that these embodiments should not be limited to disclosed embodiments but rather should be limited only by the spirit and scope of the appending claims.

What is claimed is:

1. A circuit board comprising:

a base layer having first and second opposing surfaces and at least one hole formed therein, each of the at least one holes having a hole surface;

an anodized layer disposed over the first and second surfaces of said base layer including at least a portion of the hole surface of at least one hole formed in said base later;

a conductive layer disposed over said anodized layer, said conductive layer having at least one hole formed therein wherein each of the at least one holes of said conductive layer are aligned over each of the at least one holes in said base layer;

a plating layer disposed over said conductive layer and the anodized portions of the hole surfaces in each of the at lease one holes in said base layer; and a bond film disposed between the anodized layer and the conductive layer.

2. The circuit board of claim 1 wherein the base material is provided as aluminum.

3. The circuit board of claim 1 wherein said base layer is provided as aluminum silicon carbide having an aluminum skin and an aluminum region provided therein.

4. The circuit board of claim 1 wherein the conductor is provided as copper.

5. A method for manufacturing a circuit board comprising the steps of:

forming a via hole in a base material, the via hole having a hole surface;

anodizing selected surfaces of the base material including at least a portion of the hole surface of the via hole;

disposing a conductive layer onto the anodized surfaces of the base material;

plating the conductive material in selected regions including the anodized surfaces of the via hole;

applying a bond film to the anodized surfaces; and removing the bond film from the via hole.

6. The method of claim 5 wherein the step of anodizing selected surfaces of the base material includes the steps of anodizing the entire hole surface of the via hole.

7. The method of claim 6 wherein the step of plating anodized surfaces of the base material includes the steps of plating the entire via hole.

8. The method of claim 7 wherein the step of plating the via hole includes the step of plating the via hole to provide a filled via hole.

* * * * *

UNITED STATES PATENT AND TRADEMARK OFFICE
CERTIFICATE OF CORRECTION

PATENT NO. : 5,774,336
DATED : June 30, 1998
INVENTOR(S) : Ralph I. Larson

It is certified that error appears in the above-identified patent and that said Letters Patent is hereby corrected as shown below:

Title page, item [54] and col. 1, "HIGH-TERMINAL" to --HIGH-THERMAL--.

Signed and Sealed this

Twenty-fifth Day of August, 1998

Attest:

BRUCE LEHMAN

Attesting Officer     Commissioner of Patents and Trademarks